United States Patent
Thomas et al.

(10) Patent No.: US 9,542,996 B2
(45) Date of Patent: Jan. 10, 2017

(54) DEVICE WITH SRAM MEMORY CELLS INCLUDING MEANS FOR POLARIZING WELLS OF MEMORY CELL TRANSISTORS

(71) Applicant: Commissariat a L'Energie Atomique et aux Energies Alternatives, Paris (FR)

(72) Inventors: Olivier Thomas, Revel (FR); Bastien Giraud, Voreppe (FR); Adam Makosiej, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/850,218

(22) Filed: Sep. 10, 2015

(65) Prior Publication Data

US 2016/0078924 A1    Mar. 17, 2016

(30) Foreign Application Priority Data

Sep. 10, 2014 (FR) ...................... 14 58488

(51) Int. Cl.
*G11C 7/06* (2006.01)
*G11C 11/419* (2006.01)
(Continued)

(52) U.S. Cl.
CPC ............... *G11C 11/419* (2013.01); *G11C 7/06* (2013.01); *G11C 29/44* (2013.01); *H01L 21/84* (2013.01);
(Continued)

(58) Field of Classification Search
CPC ..................................... G11C 5/02; G11C 7/06
(Continued)

(56) References Cited

U.S. PATENT DOCUMENTS 7,782,654 B2 * 8/2010 Hayashi ............... G11C 8/16
365/154
2007/0076467 A1    4/2007 Yamaoka et al.
(Continued)

FOREIGN PATENT DOCUMENTS

WO    WO 2014/057112 A1    4/2014

OTHER PUBLICATIONS

French Preliminary Search Report issued May 18, 2015 in French Application 14 58488, filed on Sep. 10, 2014 (with English Translation of Categories of Cited Documents).
(Continued)

*Primary Examiner* — Michael Tran
(74) *Attorney, Agent, or Firm* — Oblon, McClelland, Maier & Neustadt, L.L.P.

(57) ABSTRACT

A memory device includes a matrix of several columns of SRAM memory cells each including transistors forming a memory point, a read port and a write port, and such that the transistors of the read port and/or the P-type transistors include a second well with a conductivity type opposite that of a first well of the other transistors. The memory device also includes a polarization unit for the second wells, able to select and apply polarization potentials on the second wells, including a memory circuit of the polarization states of the second wells for each column or group of columns and a selection circuit applying a polarization potential on the second wells according to one of the values received as input, as a function of the stored polarization state associated with the column or group of columns.

14 Claims, 4 Drawing Sheets

(51) Int. Cl.
*H01L 21/84* (2006.01)
*H01L 29/786* (2006.01)
*H01L 27/11* (2006.01)
*H01L 27/12* (2006.01)
*G11C 29/44* (2006.01)

(52) U.S. Cl.
CPC ........ *H01L 27/1104* (2013.01); *H01L 27/1116* (2013.01); *H01L 27/1203* (2013.01); *H01L 29/786* (2013.01)

(58) Field of Classification Search
USPC .................................................. 365/51, 205
See application file for complete search history.

(56) References Cited

U.S. PATENT DOCUMENTS

| | | | |
|---|---|---|---|
| 2013/0065366 A1 | 3/2013 | Thomas et al. | |
| 2013/0182495 A1* | 7/2013 | Deng | H01L 27/0207 365/156 |
| 2013/0286718 A1* | 10/2013 | Krilic | G11C 5/148 365/154 |
| 2014/0077300 A1* | 3/2014 | Noel | H01L 27/1108 257/351 |
| 2014/0211546 A1* | 7/2014 | Jung | G11C 11/412 365/154 |

OTHER PUBLICATIONS

E. Beigne et al. "Ultra-Wide Voltage Range Designs in Fully-Depleted Silicon-On-Insulator FETs", Design, Automation & Test in Europe, Conference & Exhibition, Mar. 18, 2013, IEEE, 6 pages.

Vivek Asthana et al. "Circuit Optimization of 4T, 6T, 8T 10T SRAM Bitcells in 28nm UTBB FD-SOI Technology using Back-Gate Bias Control", 2013 Proceedings of the ESSCIRC, IEEE, Sep. 16, 2013, 4 pages.

O. Thomas et al. "6T SRAM Design for Wide Voltage Range in 28nm FDSOI", 2012 IEEE International, Oct. 1-4, 2012, 2 pages.

Yasuhiro Morita et al. "An Area-Conscious Low-Voltage-Oriented 8T-SRAM Design under DVS Environment", 2007 Symposium on VLSI Circuits Digest of Technical Papers, Jun. 14-16, 2007, 2 pages.

J. Singh et al. "A Novel Si-Tunnel FET Based Sram Design for Ultra Low-Power 0.3V $V_{DD}$ Applications", Proceedings of $15^{th}$ Asia and South Pacific Design Automation Conference (ASP-DAC), Jan. 2010, 6 pages.

Maziar Goudarzi et al. "Row/Column Redundancy to Reduce SRAM Leakage in Presence of Random Within-Die Delay Variation", Low Power Electronics and Design (ISLPED), 2008 ACM/IEEE International Symposium, Aug. 11-13, 2008, 6 pages.

Jean-Philippe Noel et al. "Multi-$V_T$ UTBB FDSOI Device Architectures for Low-Power CMOS Circuit", IEEE Transactions on Electron Devices, vol. 58, No. 8, Aug. 2011, 10 pages.

\* cited by examiner

DEVICE WITH SRAM MEMORY CELLS INCLUDING MEANS FOR POLARIZING WELLS OF MEMORY CELL TRANSISTORS

BACKGROUND OF THE INVENTION

The invention relates to the field of static random access memories (SRAM) working over very broad range of supply voltage values, and for example used in portable electronic devices such as smart phones, digital tablets, laptops, etc.

For so-called high-performance and low-consumption modern portable applications, it is interesting to use integrated circuits designed to work over a very broad range of supply voltage values so as to be able to dynamically adapt the value of the supply voltage of the circuits as a function of their use, and thus to optimize the energy performance of those circuits and reduce their electricity consumption so as to save on battery time.

In digital integrated circuits, the possible values of the supply voltage of those circuits are generally limited by the memories of those circuits. Indeed, the variability of the CMOS transistors present in the memories prevents them from working at a supply voltage as low as that of the elements forming the logic of the integrated circuits because the architecture of the memory leads to a deterioration of their performance greater than for the elements forming the logic when the supply voltage is reduced. For example, by reducing the supply voltage, the access time of the SRAM memories increases more quickly than the propagation time of the logic circuits.

In integrated circuits, several types of memories are used. The closer the memory is to the computing unit, the closer its performance and operating conditions will be to those of the computing unit. Thus, the cache memory L1, which is glued to the computing unit, is generally designed from SRAM memory cells with 6 or 8 transistors (called 6T or 8T). These memory cells are developed to achieve a better compromise of the following criteria:
  good stability of the stored information,
  ease of writing,
  a maximum read current ($I_{CELL}$) to have good performance,
  a reasonable cell size to have a high integration density associated with low deteriorations of the performance caused by metallization of the cell, and
  a minimal retention current ($I_{OFF}$) to minimize the consumed static power.

The dispersions obtained with the deca-nanometric CMOS technologies of 28 nm and less prevent, however, a guarantee of these criteria with a high performance (of approximately 5 to 6 sigmas, or an error rate of approximately $10^{-9}$). At a low voltage, these conditions are even more difficult to achieve.

In parallel to these considerations, reducing the dimensions of electronic components requires using new technologies to produce these integrated circuits. Thus, for technological nodes of 28 nm and below, the FDSOI (Fully Depleted Silicon-On-Insulator) technology makes it possible to improve the electrostatic control and dispersions of MOS transistors. Furthermore, the threshold voltage of an FDSOI transistor can be adjusted by doping and polarization on the rear face of the transistor. N- or P-wells can be used, both for NMOS and PMOS transistors. This FDSOI technology offers a means to improve the performance of memory circuits without additional design efforts.

The document "6T SRAM design for Wide Voltage Range in 28 nm FDSOI" by O. Thomas et al., SOI Conference (SOI), 2012 IEEE International, 1-4 Oct. 2012, Napa, Calif., pages 1-2, describes a 6T memory cell made using 28 nm FDSOI technology whereof the mono-P-Well architecture (only one P-well shared by all six transistors of the memory cell) makes it possible to decrease the supply voltage value of the transistors of the cell, in particular by improving writing. However, the write optimization and read optimization remain dependent on one another. Yet the reduction in the supply voltage causes a decrease in the possible read speed.

The document "An Area-Conscious Low-Voltage-Oriented 8T-SRAM Design under DVS Environment" by Y. Morita et al., VLSI Circuits, 2007 IEEE Symposium on, 14-16 Jun. 2007, Kyoto, JP, pages 256-257, describes an 8T memory cell that includes, relative to a 6T memory cell, two additional transistors forming the read port of the cell. This read port makes it possible to decorrelate the reading from the writing done in the cell because during reading, the two access transistors used for writing in the cell remain in the blocked state. As for a 6T memory cell, this alternative may be improved using FDSOI technology. However, a drop in the supply voltage of the transistors of the cell nevertheless causes a drop in the read speed that can be achieved by such a memory cell.

Furthermore, for high-performance applications, whether the memory cells include 6 or 8 transistors, the performance of the memory circuits is affected by timing faults, or synchronization faults, in read and write. A read timing fault is due to a read current of the cell that is too low to discharge a bit-line quickly enough in the allotted access time. A write timing fault is due to the excessively long switching time of the memory cell to store a bit correctly. The read timing faults can also be created by an excessively long write time because in that case, the completion of logic level "1", i.e., the transition of the potential from the node with logic level "0" toward logic level "1" during writing, is not complete (completion being able to end during the following cycle), which limits the read current during the following cycle if it involves reading because the potential in the node is then lower than the potential correspondent to logic level "1". Yet the number of cells showing such a malfunction increases when the supply voltage of the memory cells is reduced.

In the matrix of memory cells, redundancy solutions for a column or row of cells have been proposed to offset these problems, as for example described in document "Row/Column Redundancy to Reduce SRAM Leakage in Presence of Random Within-Die Delay Variation" by M. Goudarzi et al., Low Power Electronics and Design (ISLPED), 2008 ACM/IEEE International Symposium on, 11-13 Aug. 2008, Bangalore, pages 93-98. These redundancies are used to replace the columns or rows of nonfunctional memory cells, i.e., the columns or rows of cells where one or more cells create read and/or write timing faults. The possible number of redundant columns or rows nevertheless remains limited due to the fact that a certain density of the matrix must nevertheless be kept. Furthermore, this solution requires reprogramming the access circuits to the matrix.

There are also solutions based on error correction codes (ECC). They associate additional bits with the word that makes it possible to detect and correct any errors. The programming of the additional bits is done through an encoding logic and verification by a decoding logic. ECC's are very effective to respond to "software" errors (assumed to be small in quantity), but are not suitable for low-voltage applications where the error rate increases very quickly.

These read and/or write timing fault problems created by a drop in the supply voltage are also found for SRAM memory cells comprising transistors other than CMOS FDSOI transistors, such as TFET transistors as described in document "A novel Si-Tunnel FET based SRAM design for ultra low-power 0.3V VDD applications" by J. Singh et al., Proceedings of 15th Asia and South Pacific Design Automation Conference (ASP-DAC), pp. 181-186, January 2010.

BRIEF DESCRIPTION OF THE INVENTION

There is therefore a need to propose a new memory device including SRAM memory cells, for example with comprising FDSOI transistors, able to operate over a wide range of supply voltage values, and in particular to operate with a low supply voltage while greatly reducing the impact of such a drop in the supply voltage on the read speed of the memory cells. Another aim is to reduce the appearance of read and write timing faults of the memory cells, even when a low supply voltage is used and without it being necessary to use memory cell redundancy or error correction code solutions.

To that end, one embodiment proposes a memory device including at least:
  a matrix of memory cells of the SRAM type positioned next one to another while forming several columns of memory cells, each memory cell including transistors forming a memory point, a read port and a write port, and in which:
    the transistors forming the memory point and the read port include a first semiconductor well doped according to a first type of conductivity and the transistors forming the read port include a second semiconductor well doped according to a second type of conductivity opposite the first type of conductivity, or
    the N-type transistors among the transistors of the memory cell include the first well and the P-type transistors among the transistors of the memory cell includes the second well, or
    the N-type transistors among the transistors forming the memory point and the write port include the first well, and the transistors forming the read port and the P-type transistors from among the transistors forming the memory point and the write port include the second well,
  polarization means for the second wells, able to select a value of at least one polarization potential of the second wells and to apply said polarization potential on the second wells, comprising:
    a memory circuit able to store a polarization state of the second wells of the memory cells for each column or group of columns;
    a selection circuit coupled to the memory circuit, including several inputs on which different polarization potential values are intended to be applied and able to apply, on the second wells of the memory cells of each column or group of columns, one of said polarization potential values selected as a function of the polarization state stored in the memory circuit and associated with said column or said group of columns.

This memory device makes it possible to optimize the energy efficiency/performance compromise of the memory cells. It is in particular an effective way to deal with the increase in dispersions of the deca-nanometric CMOS technologies (28 nm and below). The memory device can adjust the read current of the SRAM cells by acting on the polarization of the rear face of the transistors of the read port and/or the P-type transistors of the memory cells.

For example, depending on the value of the polarization electric potential selected and applied on the second wells, the value of the threshold voltage of the transistors of the read ports is modified. By modulating the value of the threshold voltage of the transistors forming the read ports of the cells, the read speed of the cells is also modulated, which makes it possible to offset the modifications of the read speed created by a modification of the value of the supply voltage of the cells. Thus, it is possible to reduce the value of the supply voltage of the memory cells, which results in increasing the read time of the cells, the increase in the read time being able to be offset by a drop in the threshold voltage of the transistors of the read ports of the cells, which results in accelerating the discharge time of the read bit-lines through the transistors of the read ports.

In the case of memory cells in which the N-type transistors include the first well and the P-type transistors include the second well, the write performance and the stability are improved by choosing the value of the polarization electric potential selected and applied on the second wells. A compromise between the increase and the drop of the threshold voltage is sought to improve the retention and writing.

It is possible to globally control the polarization potentials applied on the second wells of the memory cells of the matrix, i.e., to a place a same potential on all of the second wells, which makes it possible to adjust the performance of the memory device as a function of the speed and consumption needs of the device.

It is also possible to locally control the polarization potentials applied on the second wells of the memory cells of the matrix, i.e., to differentiate, for example by columns or groups of columns of memory cells, the polarization potentials supplied on the second wells, which for example makes it possible to increase the excessively low read current of certain memory cells without affecting the static consumption of the entire memory device. The local control thus produced offers a means that is both dense and adjustable (over time) to improve the read performance of the memory cells. Furthermore, owing to storage of the possible polarization states of the second wells, for example for each column or group of columns of memory cells, the polarization of the rear face of the transistors of the read ports and/or P-type transistors of the memory cells of the columns can be adjustable over time as a function of the usage conditions of the memory.

The polarization means of the memory device make it possible to achieve a shared control of the polarization of one or several groups of memory cells. This choice of levels of the polarization voltages applied among the different stored polarization levels therefore makes it possible to adjust the values of the polarization voltages, such that the read and write timing faults are reduced. The polarization values thus selected are intended to be applied on the wells of transistors of memory cells during an operating duration of the memory device comprising several successive read/write cycles in the memory cells.

This memory device also represents, when the memory cells are made with FDSOI transistors, a solution to the variability, or dispersion, problems of the read current observed for FDSOI transistors. Indeed, the variability problems of the read current of the transistors are even greater when the supply voltage of those transistors is low. Thus, by independently controlling, for example for each column or group of columns, the polarization of the transistors of the read ports and/or the P-type transistors of the cells, it is possible to choose, for the columns or groups of columns whereof the cells, or part of the cells, are the lowest performing and/or involve read errors under given read access conditions, a polarization potential of the second wells of the transistors of the read ports and/or the P-type transistors that are higher than that applied for the other columns or groups of columns of the matrix in order to increase the value of the threshold voltage of those transistors.

A memory device is further described including at least:
a matrix of memory cells of the SRAM type, each memory cell including at least four first FDSOI transistors forming two inverters mounted head-to-tail and two second FDSOI transistors forming at least write access transistors, and in which:
  each memory cell further includes two third FDSOI transistors forming read access transistors, the first and second FDSOI transistors including a first semiconductor well doped according to a first type of conductivity and the third FDSOI transistors including a second semiconductor well doped according to a second type of conductivity opposite the first type of conductivity, or
  the second FDSOI transistors also form read access transistors of the memory cell, the N-type transistors from among the first and second transistors including the first well and the P-type transistors from among the first and second transistors including the second well,
polarization means for the second wells, able to select a value of at least one polarization potential of the second wells and to apply said polarization potential on the second wells.

This approach is made possible owing to the FDSOI technology and the architecture of the SRAM 6T or 8T memory cells. The memory device can adjust the read current of the SRAM cells by acting on the polarization of the rear face of the transistors of the read port, for example in the case of certain 8T memory cells, and/or on the polarization of the rear face of the P-type transistors, for example in the case of 6T memory cells.

The term "well" designates a doped semiconductor portion located under the buried oxide of each FDSOI transistor and forming the ground plane (or backplane) of each FDSOI transistor.

The memory cells may be positioned next to one another while forming several columns of memory cells, and the second wells of the memory cells of a same column may be formed by a same semiconductor portion doped according to the second type of conductivity. Furthermore, the first wells of the memory cells of a same column may be formed by a same semiconductor portion doped according to the second type of conductivity. Thus, a single polarization potential can be applied on all of the second wells of a same column of memory cells and/or on all of the first wells of a same column of memory cells.

Advantageously, the third transistors of the memory cells of two adjacent columns or of each group of two adjacent columns may be positioned next to one another such that the second wells of the memory cells of the two adjacent columns or of each of the groups of two adjacent columns may be formed by a same semiconductor portion doped according to the second type of conductivity. Thus, a single polarization potential can be applied on all of the second wells of a same group of two adjacent columns of memory cells.

In general, the second wells of the memory cells of two adjacent columns may be positioned next to one another and be formed by a same semiconductor portion doped according to the second type of conductivity, and/or the first wells of the memory cells of two adjacent columns may be positioned next to one another and formed by a same semiconductor portion doped according to the first type of conductivity. Thus, a single polarization potential can be applied on all of the second wells of two adjacent columns of memory cells and/or a single polarization potential can be applied on all of the first wells of two adjacent columns of memory cells.

First wells or second wells of memory cells of several separate columns may be electrically connected to one another by a substrate on which the matrix of memory cells is produced or by a deep well produced in the substrate, the conductivity of the substrate or of the deep well being similar to that of said wells electrically connected to one another.

The polarization means for the second wells of the memory cells may include:
  a memory circuit able to store a polarization state of the second wells of the memory cells for each column or group of two adjacent columns;
  a selection circuit coupled to the memory circuit, including several inputs on which different polarization potential values are intended to be applied and able to apply, on the second wells of the memory cells of each column or group of two adjacent columns, one of said polarization potential values selected as a function of the polarization state stored in the memory circuit and associated with said column or said group of two adjacent columns.

The selection circuit may include several multiplexers each including several inputs on which said polarization potential values are intended to be applied and an output connected to the second wells of the memory cells of one of the columns or a group of columns, such as a group of two adjacent columns.

The memory circuit may include at least one memory cell of each column and be such that each of said memory cells can be able to store a polarization state of the second wells of the memory cells of the column to which said memory cell belongs or two or more of said memory cells can be able to store a polarization state of the second wells of the memory cells of a group of columns such as a group of two adjacent columns to which the memory cells belong.

The polarization means of the second wells of the memory cells may further include:
  a test circuit coupled to the matrix of memory cells and able to detect whether one or more memory cells have a read speed creating read errors;
  a control circuit coupled to the test circuit and to the memory circuit and able to define the polarization states intended to be stored in the memory circuit as a function of results provided by the test circuit.

Thus, it is for example possible to reduce the supply voltage only for the memory cells of the columns or groups of columns, such as groups of two adjacent columns, for which no cell creates a read error.

The first type of conductivity may correspond to the P type and the second type of conductivity may correspond to the N type.

The memory device may further include polarization means for the first wells of the memory cells able to apply a zero polarization on the first wells.

According to one particular embodiment, each memory cell may include at least four first FDSOI transistors forming two inverters mounted head-to-tail corresponding to the memory point and two second FDSOI transistors forming at least the write port, and in which:

each memory cell further includes two third FDSOI transistors forming the read port, the first and second FDSOI transistors including the first well, and the third FDSOI transistors including the second well, or the second FDSOI transistors also form the read port, the N-type transistors from among the first and second transistors including the first well, and the P-type transistors from among the first and second transistors including the second well, or each memory cell further includes two third FDSOI transistors forming the read port, the N-type transistors from among the first and second transistors including the first well, and the third transistors and the P-type transistors from among the first and second transistors including the second well.

Also described is a polarization method for a memory device as defined above, including the following steps:

selecting a value of at least one polarization potential of the second wells, and applying said polarization potential on the second wells.

Another embodiment relates to a polarization method for a memory device as described above, including the following steps:

storing a polarization state of the second wells of the memory cells for each column or group of columns, selecting a value of at least one polarization potential of the second wells as a function of the polarization state stored in the memory circuit and associated with said column or said group of columns, and applying said polarization potential on the second wells of said column or said group of columns.

A value of a supply voltage of the memory cells of the memory device and the value of said at least one polarization potential may be chosen as a function of a desired read speed and electricity consumption of the memory device.

The method may be such that:

the memory cells may be positioned next to one another, forming several columns of memory cells, the second wells of the memory cells of a same column being able to be formed by a same semiconductor portion doped according to the second type of conductivity, and/or the third transistors of the memory cells of two adjacent columns or of each group of two adjacent columns may be positioned next to one another such that the second wells of the memory cells of the two adjacent columns or of each of the groups of two adjacent columns can be formed by a same semiconductor portion doped according to the second type of conductivity, the method further including a step for storing a polarization state of the second wells of the memory cells for each column or group of two adjacent columns, and the selection step may perform a selection of one of various polarization potential values as a function of the polarization state stored in the memory circuit and associated with said column or said group of two adjacent columns.

The method may further include a step for testing the matrix of memory cells detecting whether one or more memory cells have a read speed creating read errors, and a step for determining polarization states intended to be stored as a function of results of the test step.

The value of the polarization potential applied on at least part of the second wells may be strictly positive.

BRIEF DESCRIPTION OF THE DRAWINGS

The present invention will be better understood upon reading the description of example embodiments provided purely for information and non-limitingly and in reference to the appended drawings, in which.

Identical, similar or equivalent parts of the various figures described below bear the same numerical references so as to facilitate the passage from one figure to the next.

The different parts shown in the figures are not necessarily shown using a uniform scale, to make the figures more legible.

Different possibilities (alternatives and embodiments) must be understood as not being mutually exclusive and may be combined with one another.

DETAILED DESCRIPTION OF THE INVENTION

Figure 1:
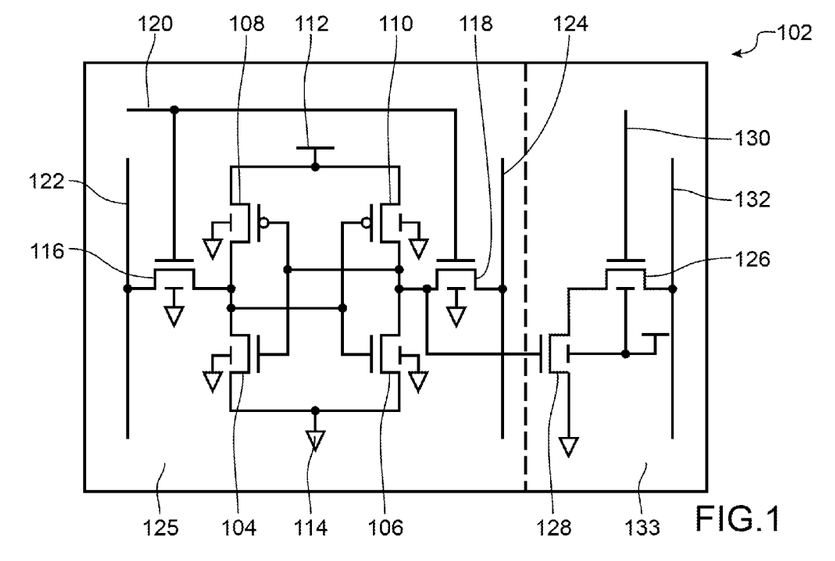
FIG. 1 diagrammatically shows an 8T memory cell of a memory device.

Reference will first be made to FIG. 1, which diagrammatically shows an 8T memory cell 102 of a memory device 100 according to one particular embodiment.

The cell 102 includes two NMOS transistors 104, 106 and two PMOS transistors 108, 110 together forming two inverters mounted head-to-tail corresponding to the memory point of the cell 102, connected to a power supply terminal 112 on which a supply potential $V_{DD}$ is applied, for example equal to approximately 1 V, and to a reference potential 114 for example corresponding to the ground of the device 100. The cell 102 also includes two access transistors 116, 118, here of the NMOS type, including their gate connected to a write word-line 120 on which a signal controlling writing in the cell 102 is intended to be sent, their drain connected to write bit-lines 122, 124 on which the data to be stored circulates, and their source connected to the inverters. The transistors 116 and 118 form the write port of the cell 102. The transistors 104 to 110, 116 and 118 are FDSOI transistors including a first doped semiconductor well 125 of the P type (P-Well) that forms the ground plane of those transistors. This first well 125 is shared by the transistors 104 to 110, 116 and 118 of the cell 102. A zero electric potential, for example that of the ground of the device 100, is applied on that first well 125.

The cell 102 also includes two NMOS transistors 126, 128 forming a read port of the cell 102. The transistor 126 includes its gate connected to a read word-line 130, its drain connected to a read bit-line 132 and its source connected to the drain of the transistor 128. The gate of the transistor 128 is connected to the memory point of the cell 102 and the source of the transistor 128 is connected to the reference electric potential 114.

Before reading of the bits stored in the cell 102, the electric potential of the read bit-line 132 is pre-charged at $V_{DD}$. The transistor 126 is next turned on via the application of a read control signal, for example corresponding to a pulse with potential equal to $V_{DD}$, on its gate from the read word-line 130. Depending on the value of the bits stored in the cell 102, the transistor 128 is on (bit in state "1") or off (bit in state "0"), which leads to a more or less significant discharge of the read current from the read bit-line 132 through the transistors 126, 128 depending on the value of the bits stored in the cell 102.

The transistors 126 and 128 are FDSOI transistors including a second shared N-well 133 forming the ground plane of those transistors. An electric potential $V_{NW}$ is applied on the second well 133 of the transistors 126, 128, the value of that potential being comprised between 0 and $V_{DDH}$, with the value of $V_{DDH}$ being able to be greater than or equal to that of $V_{DD}$, and determined as a function of the desired operating mode of the cell 102, i.e., the selected read speed/consumption compromise, as described below. In FIG. 1, the two wells 125 and 133 of different types are symbolically separated by dotted lines.

Figure 2:
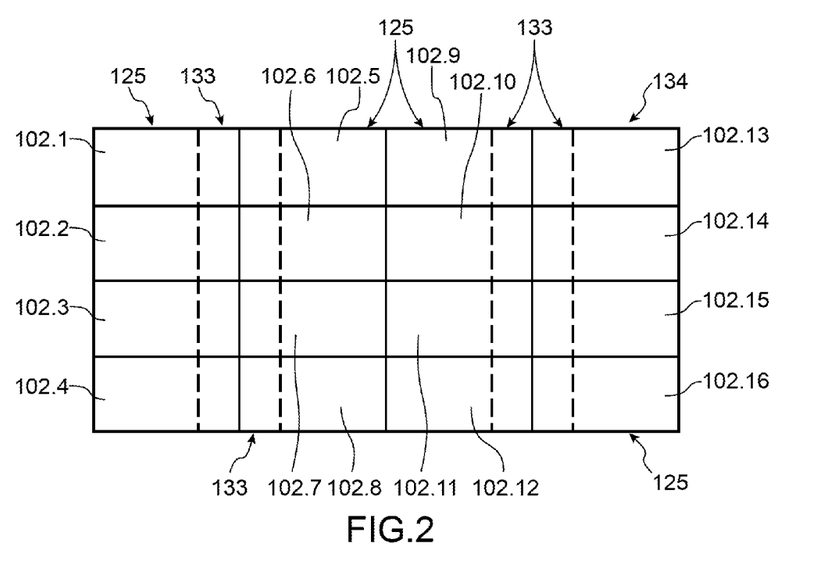
FIG. 2 diagrammatically shows a matrix of memory cells of a memory device.

The device 100 includes several memory cells similar to the cell 102 shown in FIG. 1 and positioned next to one another while forming one or more cell matrices. FIG. 2 diagrammatically shows sixteen memory cells 102.1-102.16 similar to the cell 102 previously described and positioned forming a 4×4 matrix referenced 134.

The memory cells 102.1-102.16 are made such that the read ports of the cells of a same column of the matrix are positioned above one another. Thus, the transistors 104 to 110, 116 and 118 of the cells of the same column are made on a same P-doped semiconductor portion forming the first wells of the transistors of those cells, and the transistors 126 and 128 forming the read ports of the cells of a same column are made on the same N-doped semiconductor portion forming the second wells of the transistors of those cells.

The configuration shown in FIG. 2 is advantageous because the read ports of the cells of two adjacent columns are positioned next to one another. Thus, the second wells of the transistors 126 and 128 of the cells of those two columns are formed by a same N-doped semiconductor portion. In the example of FIG. 2, the transistors of the read ports of the cells 102.1 to 102.8 include a single N-doped semiconductor portion shared by the cells and forming the second wells of the transistors 126 and 128 of those cells 102.1-102.8. The transistors of the read ports of the cells 102.9 to 102.16 include another N-doped semiconductor portion forming the second wells of the transistors 126 and 128 of those cells 102.9-102.16. Furthermore, this configuration also allows the transistors 104 to 110, 116 and 118 of the cells of the two columns whose read ports are not positioned next to one another to include a same P-doped semiconductor portion forming the first wells of those transistors. Thus, in the example of FIG. 2, the transistors 104 to 110, 116 and 118 of the cells 102.5 to 102.12 are made on the same P-doped semiconductor portion forming the first wells of those transistors.

The wells of the FDSOI transistors of the memory cells correspond to highly doped semiconductor regions, positioned below the buried dielectrics (BOX) of those transistors and which make it possible, depending on the value of the electric polarization potential applied to them, to modify the value of the threshold voltage of the transistors. By modulating the value of the threshold voltage of the transistors forming the read ports of the cells, the read speed of the cells is also modulated, which makes it possible to offset the modifications of the read speed created by a modification of the value of the supply voltage of the cells. It is thus possible to reduce the value of the supply voltage of the transistors of the memory cells, which results in increasing the read time of the cells, that increase in the read time being able to be offset by a decrease in the threshold voltage of the transistors of the read ports of the cells, which results in accelerating the discharge of the current from the read bit-lines through the transistors of the read ports.

Different example embodiments of the operation of the memory cells 102 of the device 100, corresponding to different read time/electricity consumption compromises of the cells, are described below.

In a first operating mode, when the memory cells 102 are intended to operate as quickly as possible in read mode, without seeking to reduce electricity consumption of the cells, the supply potential $V_{DD}$ of all of the transistors of the memory cells is chosen to be as high as possible, for example equal to approximately 1.3 V, and the polarization potential $V_{NW}$ of the second wells of the transistors of the read ports of the cells is also chosen to be as high as possible, i.e., equal to $V_{DDH}$, which is for example comprised between 2 and 3 V.

In a second operating mode, when the memory cells 102 are intended to operate with their nominal read speed, the value of the supply potential $V_{DD}$ of all of the transistors of the memory cells is lowered relative to that used in the first operating mode, and for example set at between 0.6 V and 1.3 V, and for example equal to approximately 1 V. The value of the polarization potential $V_{NW}$ of the second wells of the transistors of the read ports of the cells is also decreased relative to the first operating mode, and for example set between approximately $V_{DD}$ and 0 V. Thus, the consumption of the memory cells is decreased relative to that of the first operating mode, without excessively impacting the read speed of the memory cells. Alternatively, it is possible to lower only the value of $V_{DD}$ and to keep a high value for the potential $V_{NW}$.

In a third operating mode in which a very low consumption of the memory cells is sought, the supply potential $V_{DD}$ of the transistors is for example set at a value equal to approximately 0.6 V and the potential $V_{NW}$ is set at 0 V.

In a fourth operating mode in which the memory cells perform a retention of the values of the stored bits, without a read or write being done, the supply potential $V_{DD}$ is chosen to be as low as possible, for example equal to approximately 0.4 V, and the value of the polarization potential $V_{NW}$ of the second wells of the transistors of the read ports of the cells is negative so that the read transistors are polarized inversely, and for example comprised between 0 and approximately −300 mV.

Thus, for low performance constraints or when the memory cells are in a storage mode, or information retention mode, the second wells of the transistors of the read ports of cells can be polarized with zero polarization potential, or negatively polarized, which makes it possible to minimize the leak currents through those transistors. Reciprocally, for high performance constraints, the second wells of the transistors of the read ports of the cells can be polarized with a potential equal to $V_{DD}$ or higher, thus increasing the value of the read current of the cells via the reduction of the threshold voltage of the transistors of the read ports.

The value of the supply voltage $V_{DD}$ is the same for all of the transistors of the memory cells 102 of the device 100.

In a first example embodiment, the value of the potential $V_{NW}$ applied on the second wells of the transistors of the read ports of the cells 102 can be the same for all of the cells of a same cell matrix. In that case, the read time/consumption compromise is managed globally for the entire cell matrix 102.

In a second example embodiment, when the read ports of the cells of two adjacent columns are positioned next to one another, as in the example of FIG. 2, the polarization of the second wells of the transistors of the read ports of such cells can be controlled independently for each group of two adjacent columns. For example, in the case shown in FIG. 2, the polarization potential $V_{NW}$ applied on the second wells of the transistors of the read ports of the cells 102.1 to 102.8 can be chosen independently of that applied on the second wells of the transistors of the read ports of the cells 102.9 to 102.16.

In a third example embodiment, when the read ports of the cells of the columns are not positioned next to one another, the polarization of the second wells of the transistors of the read ports of such cells can be controlled independently for each of the columns.

In the above second and third example embodiments, the independent polarization for each column or each group of two adjacent columns is a solution to the problems of variability, or dispersion, of the read current observed for FDSOI transistors. Indeed, the variability problems of the read current of the transistors are even greater when the supply voltage of those transistors is low. Thus, by controlling, for each column or each group of two adjacent columns, the polarization of the transistors of the read ports of the cells independently, it is possible to choose, for the columns or groups of two adjacent columns whereof the cells, or part of the cells, are the lowest performing and/or involve read errors under given read access conditions, a polarization potential of the second wells of the transistors of the read ports that is higher than that applied for the other columns or groups of columns in order to reduce the value of the threshold voltage of those transistors.

When the polarization of the second wells of the transistors of the read ports is managed globally for all of the cells of a same matrix (the polarization potential of the second wells of the transistors of the read ports being the same for all of the memory cells of the matrix) and the device includes several matrices of memory cells, the choice of the value of the polarization potential of the second wells of the transistors of the read ports can be made at the matrix level, i.e., by choosing a value depending on whether the matrix in question includes lower performing cells and/or cells involving read errors under given read access conditions.

In the examples previously described, the first P-wells of the transistors 104 to 110, 116 and 118 of the memory cells 102, i.e., the transistors other than those of the read port, can be connected to the ground, which corresponds to the application of a zero electric polarization potential on those wells. Alternatively, when the second wells of the transistors of the read ports are negatively polarized, the first P-wells can also be negatively polarized, for example at the same potential level as that applied on the second wells of the transistors of the read ports.

Figure 3:
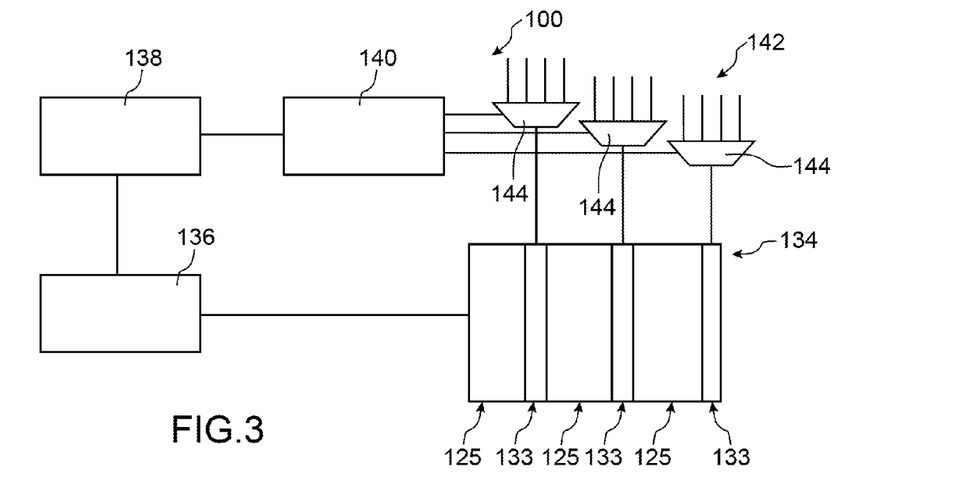
FIG. 3 diagrammatically shows a memory device according to one specific embodiment.

FIG. 3 diagrammatically shows the memory device 100, and in particular the elements of the device 100 controlling or commanding the polarization of the second wells of the transistors of the read ports of the memory cells 102 of the device 100.

The device 100 includes one or several matrices 134 of memory cells 102 similar to that previously described relative to FIG. 1. In the example of FIG. 3, a single matrix 134 of memory cells 102 is shown. Furthermore, only three columns of memory cells 102 of the matrix 134 are shown.

The matrix 134 is electrically coupled to a test circuit 136 of the Built-In Self-Test (GIST) type, making it possible to test each of the memory cells 102 and characterize their performance.

The test circuit 136 is also coupled to a control circuit 138 which, from results supplied by the test circuit 136, determines the polarization states in which the ground planes of the transistors of the read ports of the cells 102 are intended to be polarized. The test circuit 136 can for example make it possible to detect the columns of memory cells leading to read errors (under given read access conditions), and from those results, the control circuit 138 determines the columns of faulty cells that require keeping a polarization of the second wells of the transistors of the read ports with a high enough potential, for example $V_{DD}$, to reduce their access time, the second wells of the transistors of the read ports of the other columns being able to be polarized with a lower potential, for example zero, in order to minimize their consumption.

The control circuit 138 is connected to a memory circuit 140 in which the polarization states of the different columns determined by the control circuit 138 are stored. A selection circuit 142, here formed by several multiplexers 144, includes control inputs connected to the memory circuit 140. Each multiplexer 144 of the selection circuit 142 includes several inputs (four in the example of FIG. 3) on which different polarization potentials, corresponding to the different possible operating modes of the cells 102, are applied. The output of each multiplexer is connected to the second wells of the transistors of the read ports of one of the columns (or group of two adjacent columns) of memory cells of the matrix 130.

Thus, from a polarization state stored in the memory circuit 140, the circuit 142 applies one of the polarization potentials to the second wells of the transistors of the read ports of each of the columns of cells 102 of the matrix 134. The four levels of polarization potential supplied on the four inputs of each of the multiplexers 144 for example correspond to potentials corresponding to the four operating modes previously described.

Alternatively, the circuit 142 may correspond to a single multiplexer receiving, as input, the different possible polarization levels of the second wells of the transistors of the read ports of the cells 102 and applying a same polarization potential to the second wells of the transistors of the read ports of the cells of all of the columns of the matrix 134.

According to one particular embodiment, one of the polarization potentials received on each of the multiplexers 144 can correspond to that of an operating mode called "standby" mode, in which the polarization of the second wells is adjusted so as to minimize the static consumption of the memory cells 102. The value of this polarization potential is such that the value of the threshold voltages of the transistors including the second wells is increased, and in particular a reduction in the value of the polarization of the wells on which the NMOS transistors are made and an increase in the value of the polarization of the wells on which the PMOS transistors are made. This results in a certain dynamic consumption due to the change in polarization of the wells, but which is associated with a major reduction in the static consumption of the memory cells. It is therefore advantageous to use this embodiment if the memory remains therein long enough for the decrease in the static consumption of the memory cells to offset the dynamic consumption caused by that change in mode.

Alternatively, it is also possible for the number of polarization potentials supplied at the input circuit 142 to be different. It is for example possible for only two polarization potentials to be applied at the input of the circuit 142, one being able to correspond to $V_{DD}$ and the other corresponding to a zero electric potential.

Figure 4:
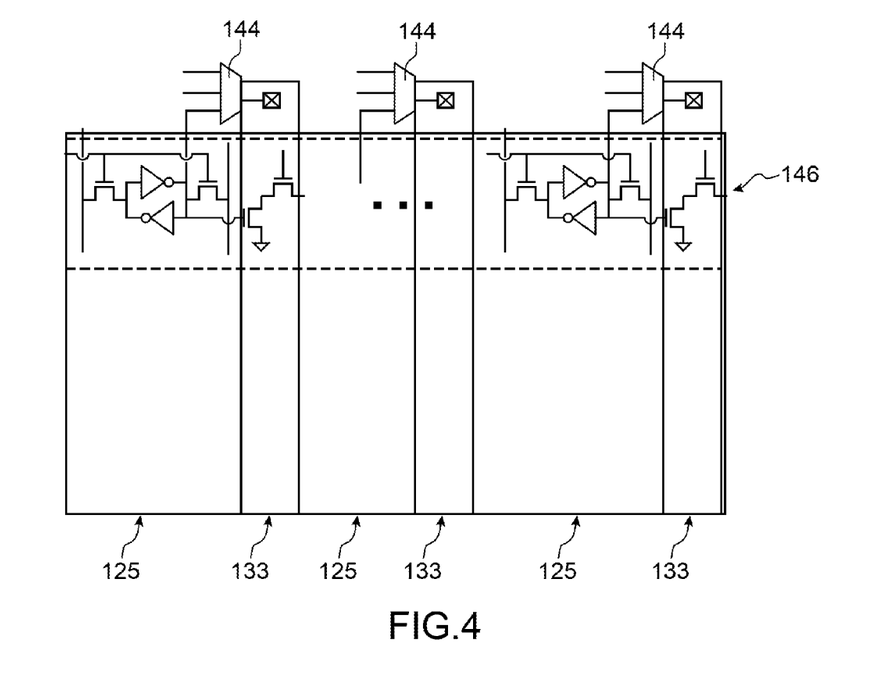
FIG. 4 diagrammatically shows part of a memory device according to an alternative embodiment.

Alternatively, it is also possible for the memory circuit 140 to be formed by a part of the cells 102 of the matrix 134. FIG. 4 diagrammatically shows such a configuration, in which each of the cells 146 of one of the rows of cells of the matrix 134 is used to store the polarization state in which the second wells of the transistors of the read ports of the cells of the column to which said cell of that row belongs are intended to be polarized. The memory point of each of the cells 146 of that row is connected to a control input of the multiplexer 144 that further includes two other data inputs on which two different levels of polarization potentials are applied, for example one corresponds to $V_{DD}$ and the other corresponds to a zero potential. The output of each multiplexer 144 is connected to the second wells of the transistors of the read ports of the cells of the corresponding column such that one of the two potentials supplied at the input of each multiplexer 144 is applied on those second wells, as a function of the value stored in the corresponding memory cell.

When the read ports of the memory cells of two adjacent columns are positioned next to one another and such that the second wells of the transistors of those read ports are formed by a same doped semiconductor portion, the two bits stored by the two cells of the row dedicated to storing the polarization states of those two columns can be used to control a single multiplexer. In that case, it is possible to use a multiplexer including four inputs so that the second wells of the transistors of the read ports of each group of two columns can be polarized according to one of the four different possible polarization levels.

The row of memory cells 146 used to store a polarization state of the second wells of the transistors of the read ports of the memory cells advantageously corresponds to the row of memory cells that is positioned opposite input/output circuits (which comprise read and write circuits) coupled to the matrix of cells.

Memory cells called end of bit-line cells are positioned at the ends of the columns of cells of the matrix and can be used to polarize the wells of the transistors of the matrix of memory cells. Metal lines aligned in the direction of the columns of the matrix and each connected to the second wells of the transistors of the read ports of the cells of one of the columns or a group of adjacent columns can be used to polarize the second wells. The polarization of the first wells of the other transistors of the cells of the matrix can be done globally for the entire matrix.

Using cells of the matrix 134 to store states in which transistors of the read ports are intended to be polarized has the advantage of being able to dynamically modify the state of the read ports, and also to very densely implement the device 100.

Furthermore, the values stored in the cells can be modified based on the needs of the application. Thus, it is possible for the user to directly choose the desired polarization states without using the test circuit 136 and the control circuit 138.

In the example embodiments previously described, the transistors 126 and 128 of the read ports of the memory cells 102 are FDSOI transistors of the NMOS type. Alternatively, it is possible for these transistors to be of the PMOS type. In that case, the source of the transistor 128 of each cell 102 is connected to the electric supply potential $V_{DD}$.

Furthermore, according to another alternative embodiment, whether the transistors 126 and 128 are of the NMOS or PMOS type, it is possible for the second wells 133 of those transistors to be formed by P-doped semiconductor portions. It is therefore possible to have the first wells 125 of the P-doped semiconductor type and second wells 133 of the N-doped semiconductor type, or, in another configuration, first N-doped semiconductor wells 125 and second P-doped semiconductor wells 133.

Lastly, according to another alternative, it is possible for the polarization potential supplied at the input of the multiplexers 144 to be different from one column to the next or from one group of two adjacent columns to the next.

Figure 5:
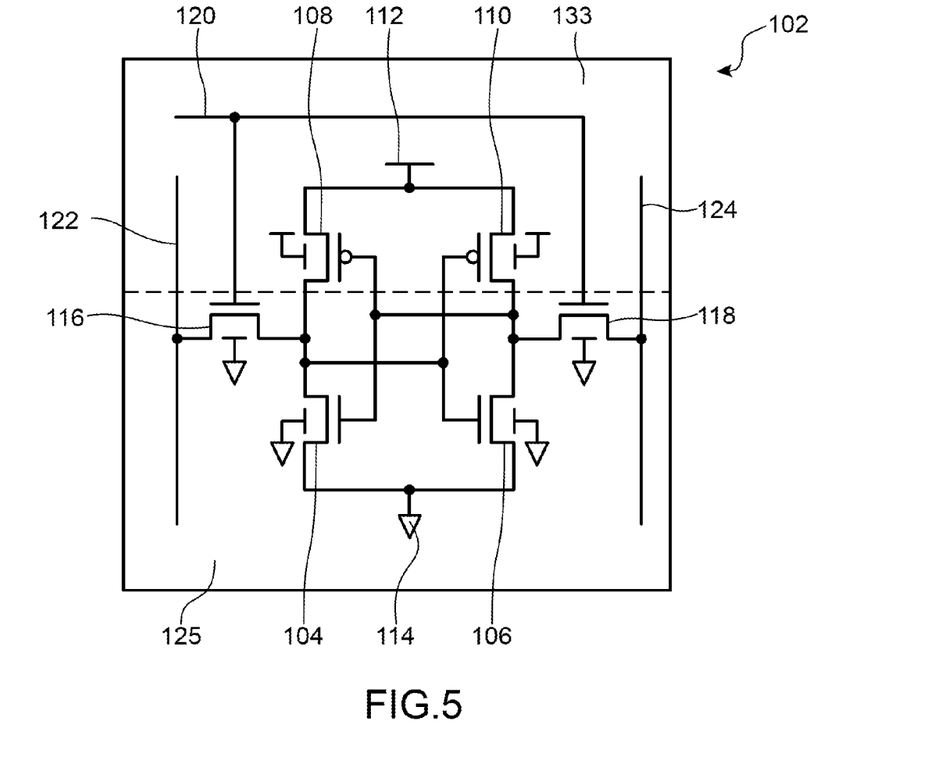
FIG. 5 diagrammatically shows a 6T memory cell of a memory device.

The principles stated above for the 8T memory cells can also be applied to 6T memory cells. FIG. 5 shows an example embodiment of such a memory cell 102 including six transistors.

As for the 8T memory cell, the 6T memory cell includes the two NMOS transistors 104, 106 and the two PMOS transistors 108, 110 together forming two inverters mounted head-to-tail corresponding to the memory point of the cell 102, and connected to the supply terminal 112 and the reference potential 114. The cell 6T also includes two access transistors 116, 118, the gates of which are connected to the line 120 here serving both as the write word-line and the read word-line. The drains of the access transistors 116, 118 are connected to the lines 122, 124 here serving as write bit-lines and read bit-lines.

The transistors corresponding to NMOS transistors, here the transistors 104, 106, 116 and 118, are FDSOI transistors including the first P-doped semiconductor well 125 that forms the ground plane of those transistors. A zero electric potential, for example that of the ground of the device 100, is applied on that first well 125.

The transistors corresponding to PMOS transistors, here the transistors 108 and 110, are FDSOI transistors including the second N-doped semiconductor well 133 that forms the ground plane of those transistors. An electric potential $V_{NW}$ is applied on the second well 133 of the transistors 108, 110, the value of that potential being comprised between 0 and $V_{DDH}$ and set as a function of the desired operating mode of the cell 102, i.e., the selected write speed/consumption compromise. In FIG. 5, the two wells 125 and 133 of different types are symbolically separated by dotted lines. Such a memory cell is called 6T RVT (Regular Threshold Voltage) memory cell.

The arrangement of the memory cells 102 in columns as previously described and allowing the pooling by column and by matrix of the second wells 133 could also be applied for 6T memory cells.

Alternatively, whether the transistors 116 and 118 can be of the same type as the transistors 108 and 110, i.e., the PMOS type in the example previously described. In that case, the bit-lines 122, 124 are pre-charged at a low voltage, for example the ground.

Alternatively, the transistors 116 and 118 are of the same type as the transistors 104 and 106 or that of the transistors 108 and 110, the first well 125 can include an N-doped semiconductor and the second well 133 can include a P-doped semiconductor. Such a memory cell is in this case called a 6T LVT (Low Threshold Voltage) memory cell.

Figure 6:
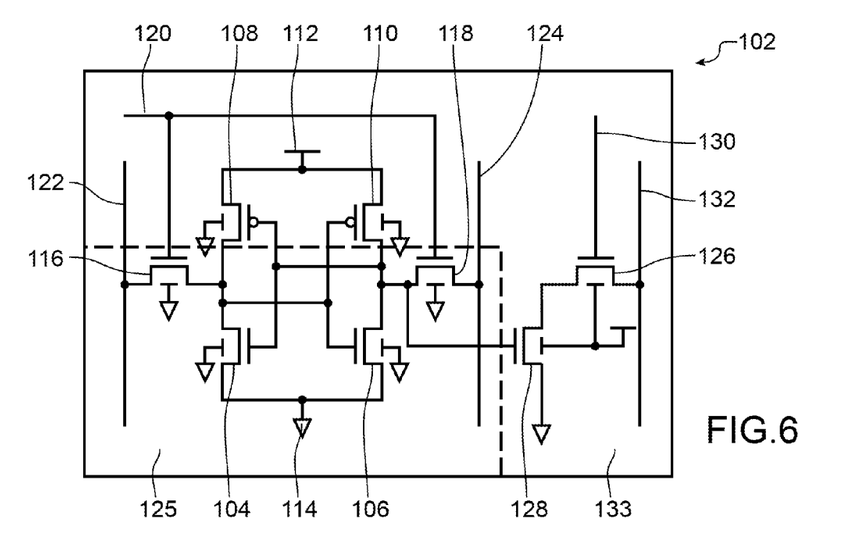
FIG. 6 diagrammatically shows an 8T memory cell of a memory device.

FIG. 6 shows another example embodiment of a memory cell 102 including eight transistors. The operation of the transistors of that memory cell 102 is similar to that of the memory cell 102 previously described in relation with FIG. 1.

In this example, the N-type transistors 104, 106, 116 and 118 include the first P-doped semiconductor well 125, which forms the ground plane for those transistors. The transistors 108, 110, 126 and 128, i.e., the (N-type) transistors forming the read port of the cell 102 and the P-type transistors among those forming the memory point and the write port of the cell 102, include the second N-doped semiconductor well 133, which forms the ground plane of those transistors. Such a memory cell 102 corresponds to an 8T RVT memory cell, i.e., a 6T RVT memory cell to which a read port, formed by the transistors 126 and 128, is added.

Alternatively, the first well 125 can include N-doped semiconductor and the second well 133 can include P-doped semiconductor. Such a memory cell 102 corresponds to an 8T LVT memory cell, i.e., a 6T LVT memory cell to which a read port, formed by the transistors 126 and 128, is added.

In the example embodiment of the device 100 previously described relative to FIG. 2, adjacent wells with a same conductivity of memory cells belonging to two adjacent columns are formed by a same shared semiconductor portion. Other types of electrical connection between the wells of memory cells belonging to adjacent columns are possible.

Figure 7:
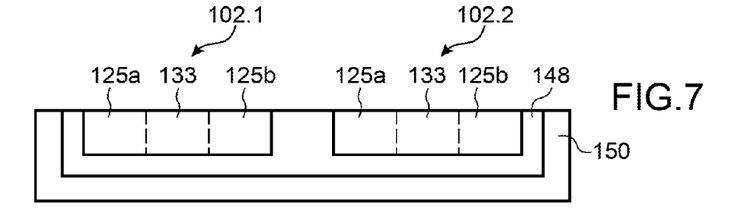
FIG. 7 diagrammatically shows wells of memory cells electrically connected to one another by a deep well.

FIG. 7 shows an example in which the electrical connections are formed, owing to a deep well, between the different wells of the two 6T LVT memory cells referenced 102.1 and 102.2 positioned next to one another. Reference 125a designates the N-wells of the transistors 104 and 116 of two cells 102.1 and 102.2, reference 133 designates the P-wells of the transistors 108 and 110 of two cells 102.1 and 102.2, and reference 125b designates the N-wells of the transistors 106 and 118 of two cells 102.1 and 102.2. The transistors of the two cells 102.1 and 102.2 are made in a deep well 148 of the N type, which in turn is formed by doping in a P-substrate 150. Thus, the wells 125a, 125b of the two memory cells 102.1 and 102.2 are all electrically connected to one another by the deep well 148 with the same conductivity as that of those wells 125a, 125b.

Similarly, if the two memory cells 102.1 and 102.2 correspond to 6T RVT memory cells (with P-wells 125a, 125b and N-wells 133 for each memory cell in that case), the wells 125a, 125b of the cells 102.1 and 102.2 can all be electrically connected to one another by the deep P-well 148 formed in the N-substrate 150.

Both for the 6T LVT memory cells and the 6T RVT memory cells, in the absence of the deep well 148, the wells 133 of the two memory cells 102.1 and 102.2 can be electrically connected to one another by the substrate 150 whereof the semiconductor has a conductivity similar to that of the wells 133.

This principle of electrical connection by a deep well or directly by the substrate between different wells of memory cells belonging to adjacent columns can also apply to the 8T memory cells previously described.

Furthermore, this principle of electrical connection by the substrate or by a deep well formed in the substrate can be combined with the principle of forming electrical connections by positioning, side by side, wells with the same conductivity and forming those wells from a same doped semiconductor portion, as previously described in relation to FIG. 2, and thus making it possible to produce shared polarizations on the wells of cells positioned on more than two adjacent columns.

Figure 8:
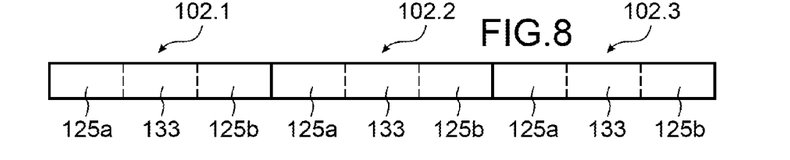
FIG. 8 diagrammatically shows wells of memory cells of the 6T type positioned within three adjacent columns.

FIG. 8 diagrammatically shows the wells of three memory cells 102.1, 102.2 and 102.3 that are adjacent in pairs and of the 6T RVT type made in a P-substrate, without the presence of a deep well. In this configuration, all of the P-wells 125a and 125b of all of the memory cells 102.1, 102.2 and 102.3 are electrically connected to one another by the P-substrate. Thus, a same polarization potential can be applied on those wells 125, 125 via the substrate, and different or similar polarization potentials can be applied on the N-wells 133 of the different cells 102.1, 102.2 and 102.3.

A configuration similar to that shown in FIG. 8 can be done from memory cells of the 6T LVT type, made from a P-substrate in the presence of a deep N-well making it possible to electrically connect the N-wells 125a, 125b to one another.

Figure 9:
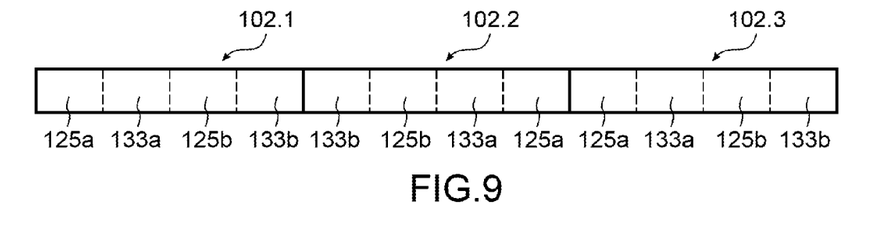
FIG. 9 diagrammatically shows wells of memory cells of the 8T type positioned within three adjacent columns.

FIG. 9 diagrammatically shows the wells of three memory cells 102.1, 102.2 and 102.3 adjacent in pairs and of the 8T RVT type made in a P-substrate, without the presence of a deep well. In this configuration, all of the P-Wells 125a and 125b of all of the memory cells 102.1, 102.2 and 102.3 are electrically connected to one another by the P-substrate. Thus, a same polarization potential can be applied on those wells 125a, 125b via the substrate. The memory cells 102.1 and 102.2 are further made such that the wells 133b, in which the transistors 126 and 128 of the read ports of the cells are formed, of the cells are adjacent. Thus, different or similar polarization potentials can be applied on the wells 133a, in which the transistors 108 and 110 are formed, and 133b of the N type for different cells 102.1, 102.2 and 102.3, with, however, a shared polarization potential applied on the wells 133b of the memory cells 102.1 and 22.2 due to the same doped semiconductor portion forming those two wells.

A configuration similar to that shown in FIG. 9 can be done from memory cells of the 8T LVT type made from a P-substrate in the presence of a deep N-well, all of the N-wells of all of the memory cells being electrically connected to one another by the deep N-well.

In the examples described above, the conductivities of the substrate and the deep well can respectively be N and P, which modifies the electrical connections formed between the wells of the memory cells.

The use of deep wells to electrically connect several wells of memory cells to one another can also apply for memory cells arranged forming a memory device of the 3D SRAM type. Furthermore, the principle of producing wells with a same conductivity of adjacent cells in the form of a single well with the same conductivity, making it possible to apply a same polarization potential on different transistors of the adjacent memory cells, can also apply for memory cells arranged forming a memory device of the 3D SRAM type. For example, in the case of 3D SRAM memory cells including NMOS transistors made in a first semiconductor level and PMOS transistors made in a second semiconductor level positioned on the first semiconductor level (or vice versa), the wells of the lower semiconductor level can be made in the form of a single well on which the wells of the upper level are positioned and independent from one column to the next.

In the case of 8T cells including two transistors forming the read ports of the cells, it is possible to produce the cells in the form of a 3D SRAM in which those transistors of the read port are made in a semiconductor level different from the other transistors of the cells. By alternating, from one column to the next, the level in which these transistors of the read port are, it is possible to obtain a control, independent from one column to the next, of the read ports of the cells.

In the different examples and embodiments described, the transistors used in the memory cells are CMOS FDSOI transistors. Alternatively, at least some of the transistors used to produce the memory cells can correspond to TFET transistors or any other type of transistor suitable for forming SRAM memory cells.

The invention claimed is:
1. A memory device comprising:
a matrix of memory cells of the SRAM type positioned next one to another while forming several columns of memory cells, each memory cell including transistors forming a memory point, a read port and a write port, wherein:
   the transistors forming the memory point and the write port include a first semiconductor well doped according to a first type of conductivity and the transistors forming the read port include a second semiconductor well doped according to a second type of conductivity opposite the first type of conductivity, or
   the N-type transistors among the transistors of the memory cell include the first well and the P-type transistors among the transistors of the memory cell include the second well, or
   the N-type transistors among the transistors forming the memory point and the write port include the first well, and the transistors forming the read port and the P-type transistors from among the transistors forming the memory point and the write port include the second well; and
polarization means for the second wells, able to select a value of at least one polarization potential of the second wells and to apply said polarization potential on the second wells, comprising:
   a memory circuit able to store a polarization state of the second wells of the memory cells for each column or group of columns, and
   a selection circuit coupled to the memory circuit, including several inputs on which different polarization potential values are intended to be applied and able to apply, on the second wells of the memory cells of each column or group of columns, one of said polarization potential values selected as a function of the polarization state stored in the memory circuit and associated with said column or said group of columns.

2. A memory device comprising:
a matrix of memory cells of the SRAM type positioned next one to another while forming several columns of memory cells, each memory cell including transistors forming a memory point, a read port and a write port, wherein:
   the transistors forming the memory point and the write port include a first semiconductor well doped according to a first type of conductivity and the transistors forming the read port include a second semiconductor well doped according to a second type of conductivity opposite the first type of conductivity, or
   the N-type transistors among the transistors of the memory cell include the first well and the P-type transistors among the transistors of the memory cell includes the second well, or
   the N-type transistors among the transistors forming the memory point and the write port include the first well, and the transistors forming the read port and the P-type transistors from among the transistors forming the memory point and the write port include the second well; and
polarization means for the second wells, able to select a value of at least one polarization potential of the second wells and to apply said polarization potential on the second wells, comprising:
   a memory circuit able to store a polarization state of the second wells of the memory cells for each column or group of columns, and
   a selection circuit coupled to the memory circuit, including several inputs on which different polarization potential values are intended to be applied and able to apply, on the second wells of the memory cells of each column or group of columns, one of said polarization potential values selected as a function of the polarization state stored in the memory circuit and associated with said column or said group of columns, wherein the second wells of the memory cells of a same column are formed by a same semiconductor portion doped according to the second type of conductivity, and/or the wherein the first wells of the memory cells of a same column are formed by a same semiconductor portion doped according to the second type of conductivity.

3. The memory device according to claim 2, wherein the second wells of the memory cells of two adjacent columns are positioned next to one another and formed by a same semiconductor portion doped according to the second type of conductivity, and/or wherein the first wells of the memory cells of two adjacent columns are positioned next to one another and formed by a same semiconductor portion doped according to the first type of conductivity.

4. The memory device according to claim 1, wherein first wells or second wells of memory cells of several separate columns are electrically connected to one another by a substrate on which the matrix of memory cells is produced or by a deep well produced in the substrate, the conductivity of the substrate or of the deep well being similar to that of said wells electrically connected to one another.

5. The memory device according to claim 1, wherein the selection circuit includes several multiplexers each comprising several inputs on which said polarization potential values are intended to be applied and an output connected to the second wells of the memory cells of one of the columns or a group of columns.

6. The memory device according to claim 1, wherein the memory circuit includes at least one memory cell of each column and is such that each of said memory cells is able to store a polarization state of the second wells of the memory cells of the column to which said memory cell belongs or several of said memory cells are able to store a polarization state of the second wells of the memory cells of a group of columns to which the memory cells belong.

7. The memory device according to claim 1, wherein the polarization means of the second wells of the memory cells further includes:
   a test circuit coupled to the matrix of memory cells and able to detect whether one or more memory cells have a read speed creating read errors;
   a control circuit coupled to the test circuit and to the memory circuit and able to define the polarization states intended to be stored in the memory circuit as a function of results provided by the test circuit.

8. The memory device according to claim 1, wherein the first type of conductivity corresponds to the P type and the second type of conductivity corresponds to the N type.

9. The memory device according to claim 1, further including polarization means for the first wells of the memory cells able to apply a zero polarization on the first wells.

10. The memory device according to claim 1, wherein each memory cell includes at least four first FDSOI transistors forming two inverters mounted head-to-tail corresponding to the memory point and two second FDSOI transistors forming at least the write port, and in which:
- each memory cell further includes two third FDSOI transistors forming the read port, the first and second FDSOI transistors including the first well, and the third FDSOI transistors including the second well, or
- the second FDSOI transistors also form the read port, the N-type transistors from among the first and second transistors including the first well, and the P-type transistors from among the first and second transistors including the second well, or
- each memory cell further includes two third FDSOI transistors forming the read port, the N-type transistors from among the first and second transistors including the first well, and the third transistors and the P-type transistors from among the first and second transistors including the second well.

11. A polarization method for a memory device which includes:
- a matrix of memory cells of the SRAM type positioned next one to another while forming several columns of memory cells, each memory cell including transistors forming a memory point, a read port and a write port, wherein:
  - the transistors forming the memory point and the write port include a first semiconductor well doped according to a first type of conductivity and the transistors forming the read port include a second semiconductor well doped according to a second type of conductivity opposite the first type of conductivity, or
  - the N-type transistors among the transistors of the memory cell include the first well and the P-type transistors among the transistors of the memory cell includes the second well, or
  - the N-type transistors among the transistors forming the memory point and the write port include the first well, and the transistors forming the read port and the P-type transistors from among the transistors forming the memory point and the write port include the second well; and polarization means for the second wells, able to select a value of at least one polarization potential of the second wells and to apply said polarization potential on the second wells, comprising:
- a memory circuit able to store a polarization state of the second wells of the memory cells for each column or group of columns, and
- a selection circuit coupled to the memory circuit, including several inputs on which different polarization potential values are intended to be applied and able to apply, on the second wells of the memory cells of each column or group of columns, one of said polarization potential values selected as a function of the polarization state stored in the memory circuit and associated with said column or said group of columns, the polarization method for a memory device, comprising:

storing a polarization state of the second wells of the memory cells for each column or group of columns, selecting a value of at least one polarization potential of the second wells as a function of the polarization state stored in the memory circuit and associated with said column or said group of columns, and applying said polarization potential on the second wells of said column or said group of columns.

12. The method according to claim 11, wherein a value of a supply voltage of the memory cells of the memory device and the value of said at least one polarization potential can be chosen as a function of a desired read speed and electricity consumption of the memory device.

13. The method according to claim 11, further including a step for testing the matrix of memory cells detecting whether one or more memory cells have a read speed creating read errors, and a step for determining polarization states intended to be stored as a function of results of the test step.

14. The method according to claim 11, wherein the value of the polarization potential applied on at least part of the second wells is strictly positive.

* * * * *